United States Patent
Chandra et al.

(10) Patent No.: US 8,723,302 B2
(45) Date of Patent: May 13, 2014

(54) INTEGRATED CIRCUIT PACKAGE SYSTEM WITH INPUT/OUTPUT EXPANSION

(75) Inventors: Harry Chandra, Mountain House, CA (US); Flynn Carson, Redwood City, CA (US)

(73) Assignee: Stats Chippac Ltd., Singapore (SG)

(*) Notice: Subject to any disclaimer, the term of this patent is extended or adjusted under 35 U.S.C. 154(b) by 841 days.

(21) Appl. No.: 12/333,298

(22) Filed: Dec. 11, 2008

(65) Prior Publication Data

US 2010/0148344 A1   Jun. 17, 2010

(51) Int. Cl.
*H01L 23/02* (2006.01)
*H01L 21/44* (2006.01)

(52) U.S. Cl.
USPC ........................................ 257/686; 438/109

(58) Field of Classification Search
USPC .................. 257/685–686, 690, 693, 777–779, 257/E23.169; 438/107–109
See application file for complete search history.

(56) References Cited

U.S. PATENT DOCUMENTS

| | | | |
|---|---|---|---|
| 7,098,528 B2 | 8/2006 | Vasishta et al. | |
| 7,288,841 B2 | 10/2007 | Yamano | |
| 7,372,141 B2 | 5/2008 | Karnezos et al. | |
| 7,800,212 B2 | 9/2010 | Yoon et al. | |
| 2006/0175695 A1* | 8/2006 | Lee ................................. | 257/686 |
| 2007/0108583 A1 | 5/2007 | Shim et al. | |
| 2007/0246813 A1 | 10/2007 | Ong et al. | |
| 2009/0127715 A1 | 5/2009 | Shin et al. | |
| 2009/0283889 A1 | 11/2009 | Jang et al. | |

* cited by examiner

*Primary Examiner* — Hoa B Trinh
(74) *Attorney, Agent, or Firm* — Ishimaru & Associates LLP

(57) ABSTRACT

An integrated circuit package system includes: forming a base stacking package including: fabricating a base substrate, mounting an integrated circuit on the base substrate, positioning an input/output expansion substrate, having access ports around an inner array area, over the integrated circuit, and injecting a molding compound on the base substrate, the integrated circuit, and the input/output expansion substrate; and mounting a top package on the input/output expansion substrate.

20 Claims, 5 Drawing Sheets

INTEGRATED CIRCUIT PACKAGE SYSTEM WITH INPUT/OUTPUT EXPANSION

TECHNICAL FIELD

The present invention relates generally to integrated circuit packaging, and more particularly to a system for producing a multichip stacked package-on-package device.

BACKGROUND ART

Electronic systems are constantly shrinking. Manufacturers demand more integrated circuits be put in an integrated circuit package, while providing less physical space in the system for the increased integrated circuit content. Some technologies have primarily focused on integrating more functions into each integrated circuit. Other technologies have focused on stacking these integrated circuits in a single package or finding ways to stack individual packages one on top of the other. While these approaches provide more functions within a given area of the system circuit board, they do not fully address the requirements for lower height, smaller space, and cost reduction.

Modern electronics, such as smart phones, personal digital assistants, global positioning devices, servers, and storage arrays, are packing more integrated circuits into an ever shrinking physical space with expectations for decreasing cost. Many technologies have been developed to meet these requirements. Some of the research and development strategies focus on new package technologies while others focus on improving the existing package technologies. Research and development in the existing package technologies may squeeze as much space as possible from these configurations by shrinking the thickness and area of the individual package technologies.

One proven way to reduce cost is to use package technologies with existing manufacturing methods and equipments. The reuse of existing manufacturing processes does not typically result in the reduction of package dimensions. The existing machinery may require certain package dimensions in order to operate properly. Existing package technologies struggle to cost effectively meet the ever-increasing demand for increased functional density of today's integrated circuits and packages.

Many packaging approaches may stack multiple integrated circuit dice or packages within a standard package footprint. The electrical connections to the each of the stacked integrated circuits may be problematic. They require clearance space typically provided by spacers, such as silicon or interposers which may limit the options as to how a package might be assembled.

As more functions are housed in the individual packages, the number of input/output interconnects has skyrocketed. The restriction on the number and position of these interconnects has further limited the ability to stack high pin count devices whether they be at the die or package level.

Thus, a need still remains for an integrated circuit package system with input/output expansion. In view of the ever-increasing demand for new products providing additional functions within reduced size requirements, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: forming a base stacking package including: fabricating a base substrate, mounting an integrated circuit on the base substrate, positioning an input/output expansion substrate, having access ports around an inner array area, over the integrated circuit, and injecting a molding compound on the base substrate, the integrated circuit, and the input/output expansion substrate; and mounting a top package on the input/output expansion substrate.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
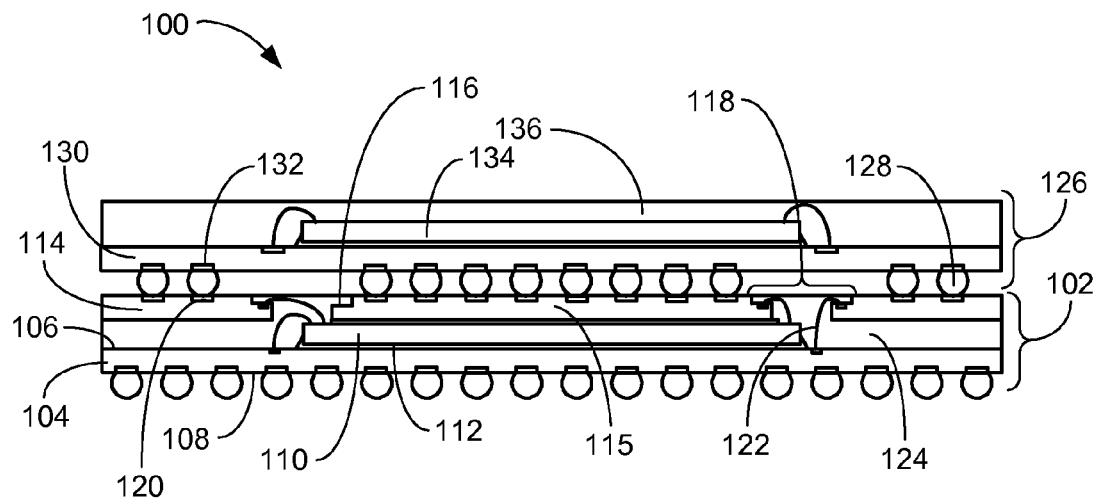
FIG. 1 is a cross-sectional view along the section line 1-1 of FIG. 11 of an integrated circuit package system with input/output expansion, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the apparatus of the present invention in accordance with the context in which the term is used. The term "processing" as used herein includes stamping, forging, patterning, exposure, development, etching, cleaning, and/or removal of the material or laser trimming as required in forming a described structure.

Figure 11:
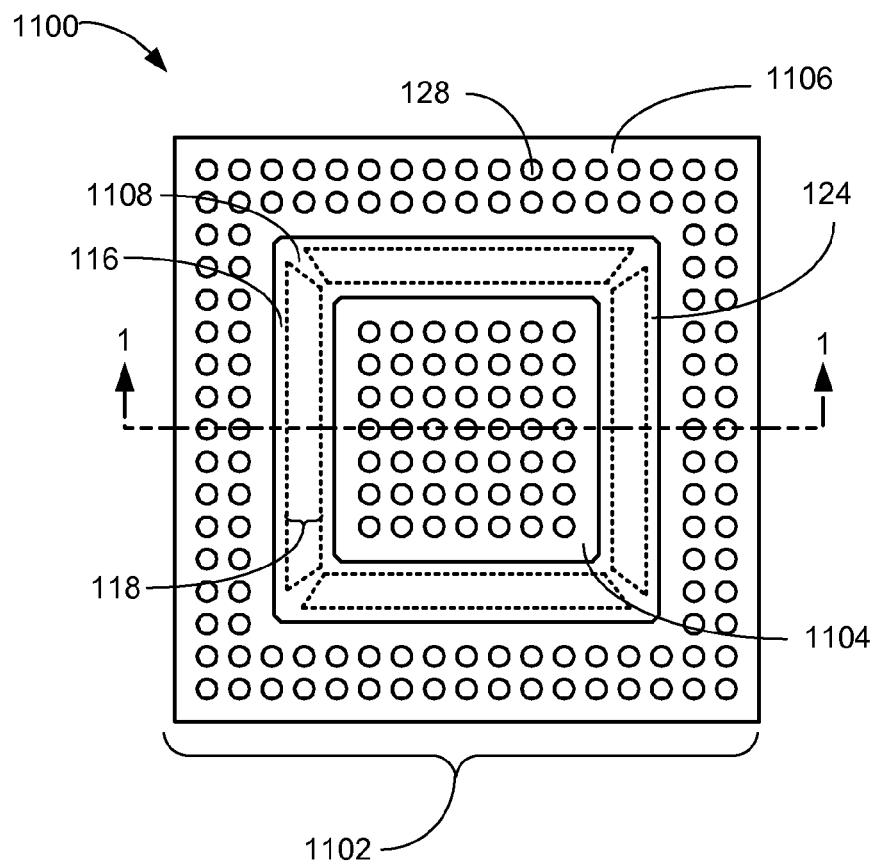
FIG. 11 is a plan view of an integrated circuit package system with input/output expansion, in an embodiment of the present invention.

Referring now to FIG. 1, therein is shown a cross-sectional view along the section line 1-1 of FIG. 11 of an integrated circuit package system 100 with input/output expansion, in an embodiment of the present invention. The cross-sectional view of the integrated circuit package system 100 depicts a base stacking package 102 including a base substrate 104 having a component side 106 and a system side 108. An integrated circuit 110 may be mounted on the component side 106 by an adhesive 112, such as a die attach material.

An input/output expansion substrate 114, such as a laminate substrate, a ceramic substrate, or a tape substrate, may be mounted over the integrated circuit 110 by the adhesive 112. The input/output expansion substrate 114 may have an inner array area 115 with a recessed step 116 along the edge of an access port 118. A bonding contact 120 may be formed on the top surface of the input/output expansion substrate 114 including the recessed step 116. An electrical interconnect 122 may be coupled between the active side of the integrated circuit 110, the component side 106 of the base substrate 104, the bonding contact 120 on the recessed step 116, or a combination thereof. The electrical interconnect 122 can directly connect electrically the integrated circuit 110 to the base substrate 104. The input/output expansion substrate 114 may provide an expanded area for input/output connections thereby allowing an increased number of the bonding contact 120.

It has been discovered that by providing the access port 118 around the inner array area 115 of the input/output expansion substrate 114, an increase in the number of the bonding contacts 120 is possible. As the electrical interconnects 122 may be coupled between the component side 106 of the base substrate 104, the integrated circuit 110, or a combination thereof, more interconnect options are possible.

The base stacking package 102 may be formed by injecting a molding compound 124, such as an epoxy molding compound on the base substrate 104, the integrated circuit 110, the electrical interconnects 122, and the input/output expansion substrate 114. The molding compound 124 provides a flat surface on the base stacking package 102 while leaving the top surface of the input/output expansion substrate 114 exposed.

A top package 126 may be coupled to the top surface of the input/output expansion substrate 114 by system interconnects 128, such as solder balls, solder columns, solder bumps, or stud bumps. The top package 126 may include a package substrate 130, such as a laminate substrate, a ceramic substrate, a metal lead frame based substrate, or a tape substrate, having a system contact 132 on the bottom of the package substrate 130. The system interconnects 128 may form an electrical connection between the top package 126 and the input/output expansion substrate 114.

A top package integrated circuit 134 may be mounted on the package substrate 130 by the adhesive 112. The electrical interconnects may couple the top package integrated circuit 134 to the package substrate 130. A package body 136 may be formed on the top package 126 by injecting the molding compound 124 on the package substrate 130, the top package integrated circuit 134, and the electrical interconnects 122.

The construction of the top package 126 is an example only. The top package 126 may contain more than one of the top package integrated circuit 134, such as a wire bond type, a flip chip type of integrated circuit, or a combination thereof. The top package 126 may also contain discrete components (not shown), such as resistors, capacitors, inductors, voltage regulators, or the like. The number and position of the system interconnects 128 is an example only. A different number of the system interconnects 128 may be used to provide conductive paths between the top package integrated circuit 134, the integrated circuit 110, the system interconnects 128 on the system side 108 of the base substrate 104, or a combination thereof.

It has been discovered that a higher number of the bonding contact 120 may be provided for establishing electrical connections between the base stacking package 102 and the top package 126. The electrical interconnects 122 may provide an electrical connection between the base substrate 104, the integrated circuit 110, the bonding contacts 120, or a combination thereof. The increased number of the bonding contacts 120 accessible on the top of the input/output expansion substrate 114 may allow connection of the top package 126, such as a high ball count ball grid array (BGA).

Figure 2:
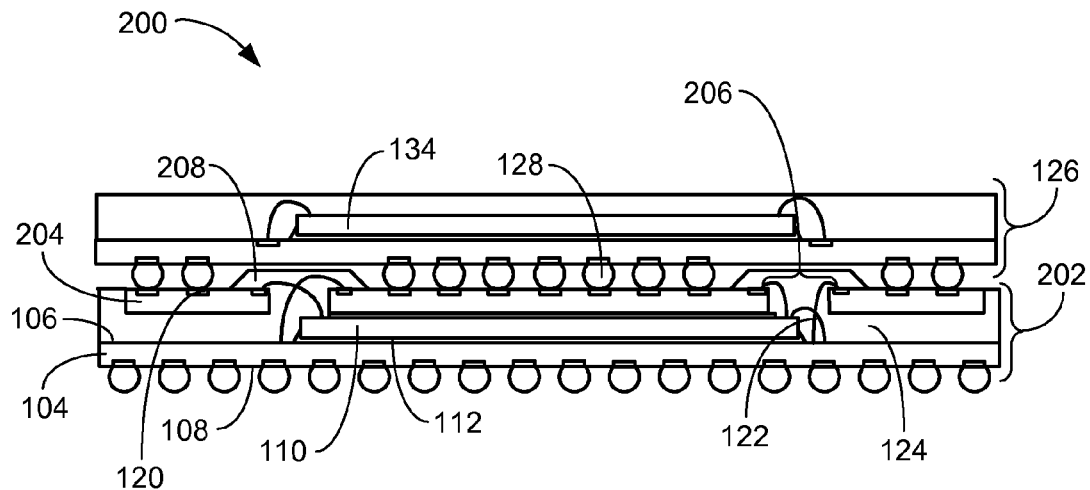
FIG. 2 is a cross-sectional view similar to FIG. 1 of an integrated circuit package system with input/output expansion, in an alternative embodiment of the present invention.

Referring now to FIG. 2, therein is shown a cross-sectional view similar to FIG. 1 of an integrated circuit package system 200 with input/output expansion, in an alternative embodiment of the present invention. The cross-sectional view of the integrated circuit package system 200 depicts a base stacking package 202 including the base substrate 104 having the component side 106 and the system side 108. The integrated circuit 110 may be mounted on the component side 106 by the adhesive 112, such as a die attach material.

An input/output expansion substrate 204, such as a laminate substrate, a ceramic substrate, or a tape substrate, may be mounted over the integrated circuit 110 by the adhesive 112. The input/output expansion substrate 204 may have the edge of an access port 206 without the recessed step 116. The bonding contact 120 may be formed on the top surface of the input/output expansion substrate 204 including around the edge of the access port 206. The electrical interconnect 122 may be coupled between the active side of the integrated circuit 110, the component side 106 of the base substrate 104, the bonding contact 120 adjacent to the access port 206, or a combination thereof.

The base stacking package 202 may be formed by injecting the molding compound 124, such as an epoxy molding compound on the base substrate 104, the integrated circuit 110, the electrical interconnects 122, and the input/output expansion substrate 204. The molding compound 124 provides a mold cap 208 on the base stacking package 202. The mold cap 208 may be on the electrical interconnects 122 and the access port 206 while leaving the top surface of the input/output expansion substrate 204 exposed. The mold cap 208 may also provide a support for the top package 126 during the reflow process in order to prevent the collapse of the system interconnects 128.

The top package 126 may be coupled to the top surface of the input/output expansion substrate 204 by the system interconnects 128, such as solder balls, solder columns, solder bumps, or stud bumps. The number and position of the system interconnects 128 is an example only. A different number of the system interconnects 128 may be used to provide conductive paths between the top package integrated circuit 134, the integrated circuit 110, the system interconnects 128 on the system side 108 of the base substrate 104, or a combination thereof.

Figure 3:
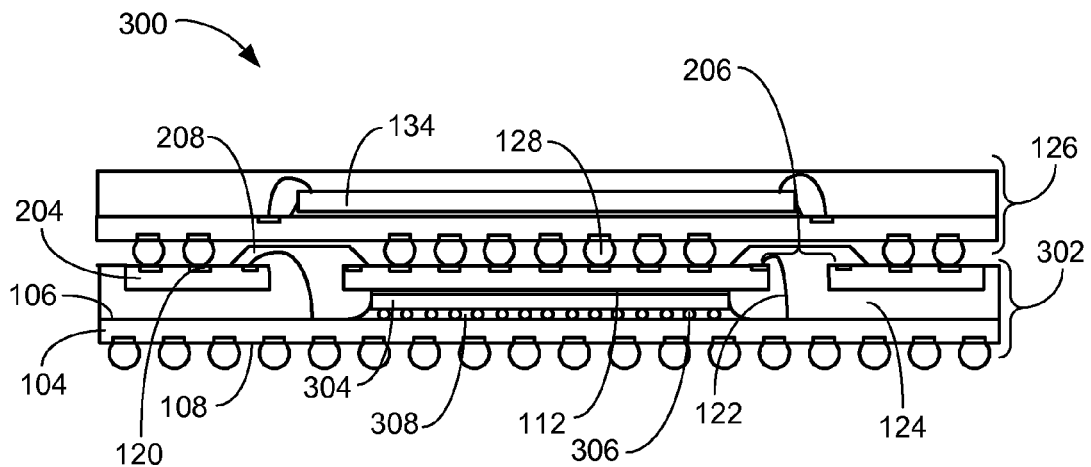
FIG. 3 is a cross-sectional view similar to FIG. 1 of an integrated circuit package system with input/output expansion, in a second alternative embodiment of the present invention.

Referring now to FIG. 3, therein is shown a cross-sectional view similar to FIG. 1 of an integrated circuit package system 300 with input/output expansion, in a second alternative embodiment of the present invention. The cross-sectional view of the integrated circuit package system 300 depicts a base stacking package 302 including the base substrate 104 having the component side 106 and the system side 108. An integrated circuit 304, such as a flip chip integrated circuit, may be mounted on the component side 106 by chip interconnects 306, such as solder balls, solder columns, solder bumps, or stud bumps. An under-fill material 308 may optionally be applied on the chip interconnects 306, between the integrated circuit 304 and the component side 106 of the base substrate 104.

The input/output expansion substrate 204, such as a laminate substrate, a ceramic substrate, or a tape substrate, may be mounted over the integrated circuit 304 by the adhesive 112. The input/output expansion substrate 204 may have the access port 206 for coupling the electrical interconnect 122. The bonding contact 120 may be formed on the top surface of the input/output expansion substrate 204 including around the edge of the access port 206. The electrical interconnect 122 may be coupled between the component side 106 of the base substrate 104 and the bonding contact 120 adjacent to the access port 206.

The base stacking package 302 may be formed by injecting the molding compound 124, such as an epoxy molding compound on the base substrate 104, the integrated circuit 304, the electrical interconnects 122, and the input/output expansion substrate 204. The molding compound 124 provides the mold cap 208 on the base stacking package 202. The mold cap 208 may be on the electrical interconnects 122 and the access port 206 while leaving the top surface of the input/output expansion substrate 204 exposed. The mold cap 208 may also provide a support for the top package 126 during the reflow process in order to prevent the collapse of the system interconnects 128.

The top package 126 may be coupled to the top surface of the input/output expansion substrate 204 by the system interconnects 128, such as solder balls, solder columns, solder bumps, or stud bumps. The number and position of the system interconnects 128 is an example only. A different number of the system interconnects 128 may be used to provide conductive paths between the top package integrated circuit 134, the integrated circuit 304, the system interconnects 128 on the system side 108 of the base substrate 104, or a combination thereof.

Figure 4:
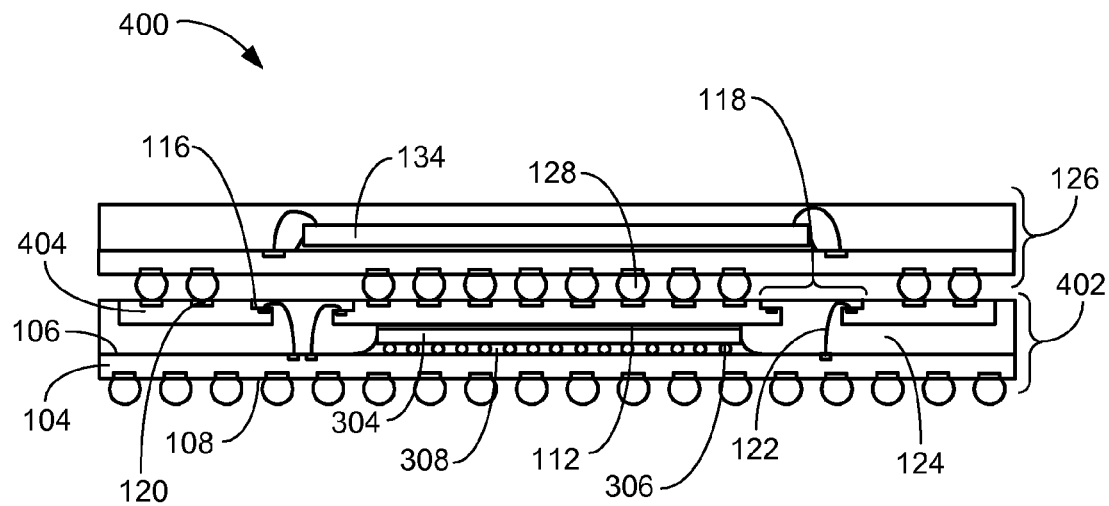
FIG. 4 is a cross-sectional view similar to FIG. 1 of an integrated circuit package system with input/output expansion, in a third alternative embodiment of the present invention.

Referring now to FIG. 4, therein is shown a cross-sectional view similar to FIG. 1 of an integrated circuit package system 400 with input/output expansion, in a third alternative embodiment of the present invention. The cross-sectional view of the integrated circuit package system 400 depicts a base stacking package 402 including the base substrate 104 having the component side 106 and the system side 108. The integrated circuit 304, such as a flip chip integrated circuit, may be mounted on the component side 106 by the chip interconnects 306, such as solder balls, solder columns, solder bumps, or stud bumps. The under-fill material 308 may optionally be applied on the chip interconnects 306, between the integrated circuit 304 and the component side 106 of the base substrate 104.

An input/output expansion substrate 404, such as a laminate substrate, a ceramic substrate, or a tape substrate, may be mounted over the integrated circuit 304 by the adhesive 112. The input/output expansion substrate 404 may have the access port 118 for coupling the electrical interconnect 122 on the recessed step 116. The bonding contact 120 may be formed on the top surface of the input/output expansion substrate 404 including on the recessed step 116 positioned around the edge of the access port 118. The electrical interconnect 122 may be coupled between the component side 106 of the base substrate 104 and the bonding contact 120 on the recessed step 116.

The base stacking package 402 may be formed by injecting the molding compound 124, such as an epoxy molding compound on the base substrate 104, the integrated circuit 304, the electrical interconnects 122, and the input/output expansion substrate 404. The molding compound 124 provides a flat surface on the base stacking package 102 while leaving the top surface of the input/output expansion substrate 404 exposed.

The top package 126 may be coupled to the top surface of the input/output expansion substrate 404 by the system interconnects 128, such as solder balls, solder columns, solder bumps, or stud bumps. The number and position of the system interconnects 128 is an example only. A different number of the system interconnects 128 may be used to provide conductive paths between the top package integrated circuit 134, the integrated circuit 304, the system interconnects 128 on the system side 108 of the base substrate 104, or a combination thereof.

Figure 5:
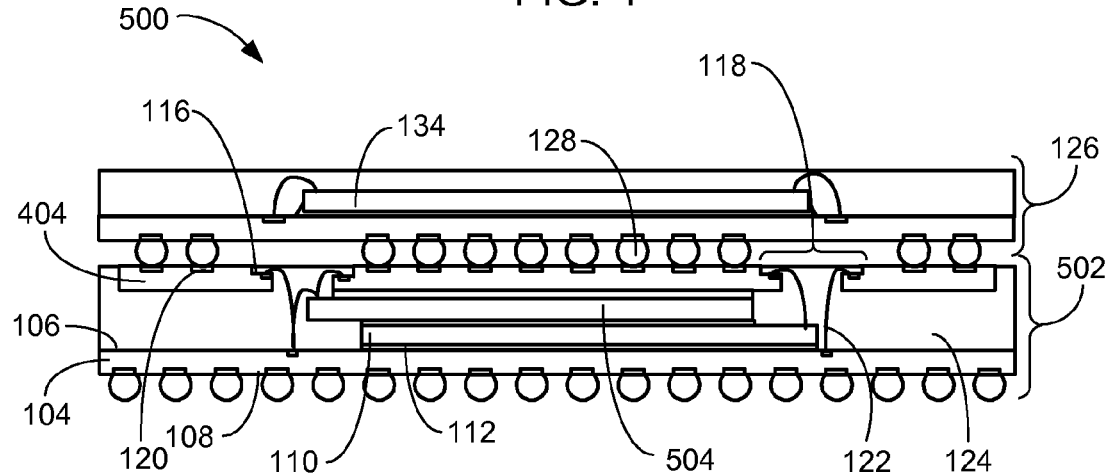
FIG. 5 is a cross-sectional view similar to FIG. 1 of an integrated circuit package system with input/output expansion, in a fourth alternative embodiment of the present invention.

Referring now to FIG. 5, therein is shown a cross-sectional view similar to FIG. 1 of an integrated circuit package system 500 with input/output expansion, in a fourth alternative embodiment of the present invention. The cross-sectional view of the integrated circuit package system 500 depicts a base stacking package 502 including the base substrate 104 having the component side 106 and the system side 108. The integrated circuit 110 may be mounted on the component side 106 by the adhesive 112. A second integrated circuit 504 may be mounted over the integrated circuit 110 by the adhesive 112. The second integrated circuit 504 may be mounted in a staggered position over the integrated circuit 110 or it may be mounted on the component side 106 adjacent to the integrated circuit 110.

The input/output expansion substrate 404 may be mounted over the integrated circuit 110 and the second integrated circuit 504 by the adhesive 112. The input/output expansion substrate 404 may have the recessed step 116 along the edge of the access port 118. The bonding contact 120 may be formed on the top surface of the input/output expansion substrate 404 including the recessed step 116. The electrical interconnects 122 may be coupled between the active side of the integrated circuit 110, the second integrated circuit 504, the component side 106 of the base substrate 104, the bonding contact 120 on the recessed step 116, or a combination thereof.

The base stacking package 502 may be formed by injecting the molding compound 124, such as an epoxy molding compound on the base substrate 104, the integrated circuit 110, the second integrated circuit 504, the electrical interconnects 122, and the input/output expansion substrate 404. The molding compound 124 provides a flat surface on the base stacking package 502 while leaving the top surface of the input/output expansion substrate 404 exposed.

The top package 126 may be coupled to the top surface of the input/output expansion substrate 404 by the system interconnects 128. The number and position of the system interconnects 128 is an example only. A different number of the system interconnects 128 may be used to provide conductive paths between the top package integrated circuit 134, the integrated circuit 110, the second integrated circuit 504, the system interconnects 128 on the system side 108 of the base substrate 104, or a combination thereof.

Figure 6:
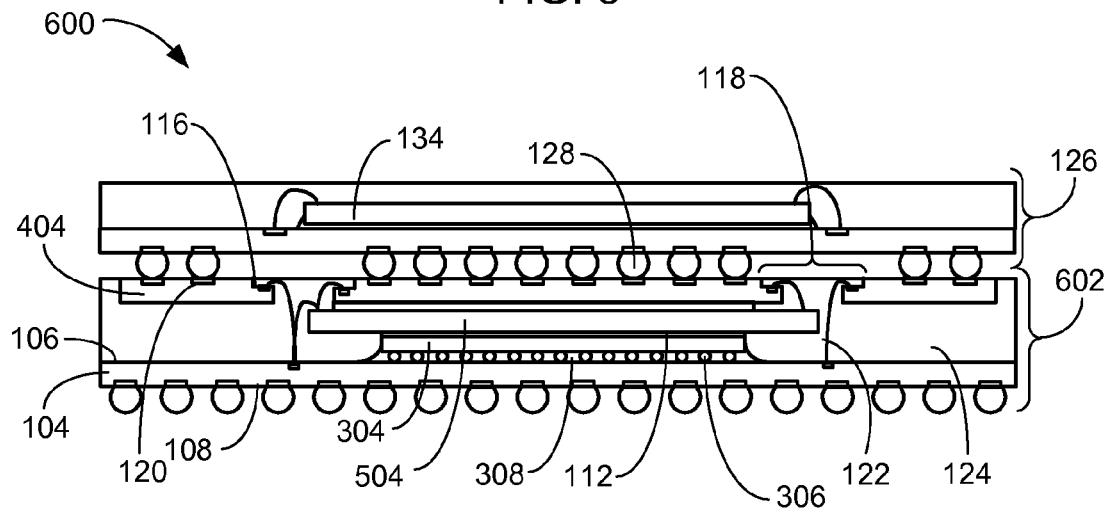
FIG. 6 is a cross-sectional view similar to FIG. 1 of an integrated circuit package system with input/output expansion, in a fifth alternative embodiment of the present invention.

Referring now to FIG. 6, therein is shown a cross-sectional view similar to FIG. 1 of an integrated circuit package system 600 with input/output expansion, in a fifth alternative embodiment of the present invention. The cross-sectional view of the integrated circuit package system 600 depicts a base stacking package 602 including the base substrate 104 having the component side 106 and the system side 108. The integrated circuit 304, such as a flip chip integrated circuit, may be mounted on the component side 106 by the chip interconnects 306, such as solder balls, solder columns, solder bumps, or stud bumps. The under-fill material 308 may optionally be applied on the chip interconnects 306, between the integrated circuit 304 and the component side 106 of the base substrate 104. The second integrated circuit 504 may be mounted over the integrated circuit 304 by the adhesive 112. The second integrated circuit 504 may be mounted in a centered position over the integrated circuit 304 or it may be mounted on the component side 106 adjacent to the integrated circuit 304.

The input/output expansion substrate 404 may be mounted over the integrated circuit 304 and the second integrated circuit 504 by the adhesive 112. The input/output expansion substrate 404 may have the recessed step 116 along the edge of the access port 118. The bonding contact 120 may be formed on the top surface of the input/output expansion substrate 404 including the recessed step 116. The electrical interconnects 122 may be coupled between the second integrated circuit 504, the component side 106 of the base substrate 104, the bonding contact 120 on the recessed step 116, or a combination thereof.

The base stacking package 602 may be formed by injecting the molding compound 124, such as an epoxy molding compound on the base substrate 104, the integrated circuit 304, the second integrated circuit 504, the electrical interconnects 122, and the input/output expansion substrate 404. The molding compound 124 provides a flat surface on the base stacking package 102 while leaving the top surface of the input/output expansion substrate 404 exposed.

The top package 126 may be coupled to the top surface of the input/output expansion substrate 404 by the system interconnects 128. The number and position of the system interconnects 128 is an example only. A different number of the system interconnects 128 may be used to provide conductive paths between the top package integrated circuit 134, the integrated circuit 304, the second integrated circuit 504, the system interconnects 128 on the system side 108 of the base substrate 104, or a combination thereof.

Figure 7:
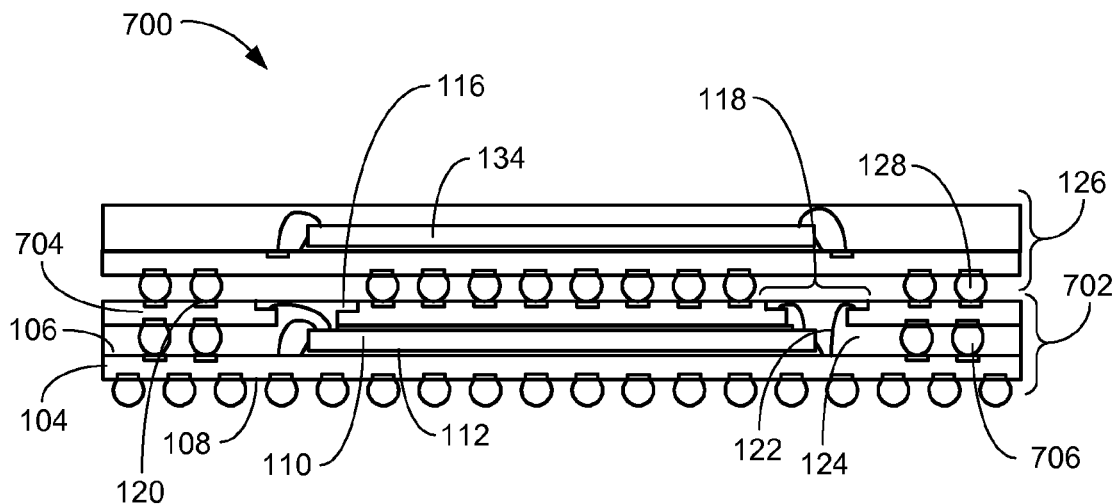
FIG. 7 is a cross-sectional view similar to FIG. 1 of an integrated circuit package system with input/output expansion, in a sixth alternative embodiment of the present invention.

Referring now to FIG. 7, therein is shown a cross-sectional view similar to FIG. 1 of an integrated circuit package system 700 with input/output expansion, in a sixth alternative embodiment of the present invention. The cross-sectional view of the integrated circuit package system 700 depicts a base stacking package 702 including the base substrate 104 having the component side 106 and the system side 108. The integrated circuit 110 may be mounted on the component side 106 by the adhesive 112.

An input/output expansion substrate 704 may be mounted over the integrated circuit 110 by the adhesive 112. The input/output expansion substrate 704 may have the recessed step 116 along the edge of the access port 118. The bonding contact 120 may be formed on the top surface of the input/output expansion substrate 704 including the recessed step 116. The electrical interconnects 122 may be coupled between the active side of the integrated circuit 110, the component side 106 of the base substrate 104, the bonding contact 120 on the recessed step 116, or a combination thereof.

Further conductive paths may be provided by an interposer interconnect 706, such as a solder ball, solder column, or stud bump, that may be coupled between the component side 106 of the base substrate 104 and the input/output expansion substrate 704. By providing these additional conductive paths, additional functions may be supported in the top package 126.

The base stacking package 702 may be formed by injecting the molding compound 124, such as an epoxy molding compound on the base substrate 104, the integrated circuit 110, the electrical interconnects 122, the interposer interconnects 706, and the input/output expansion substrate 704. The molding compound 124 provides a flat surface on the base stacking package 702 while leaving the top surface of the input/output expansion substrate 704 exposed.

The top package 126 may be coupled to the top surface of the input/output expansion substrate 704 by the system interconnects 128. The number and position of the system interconnects 128 is an example only. A different number of the system interconnects 128 may be used to provide conductive paths between the top package integrated circuit 134, the integrated circuit 110, the system interconnects 128 on the system side 108 of the base substrate 104, or a combination thereof.

Figure 8:
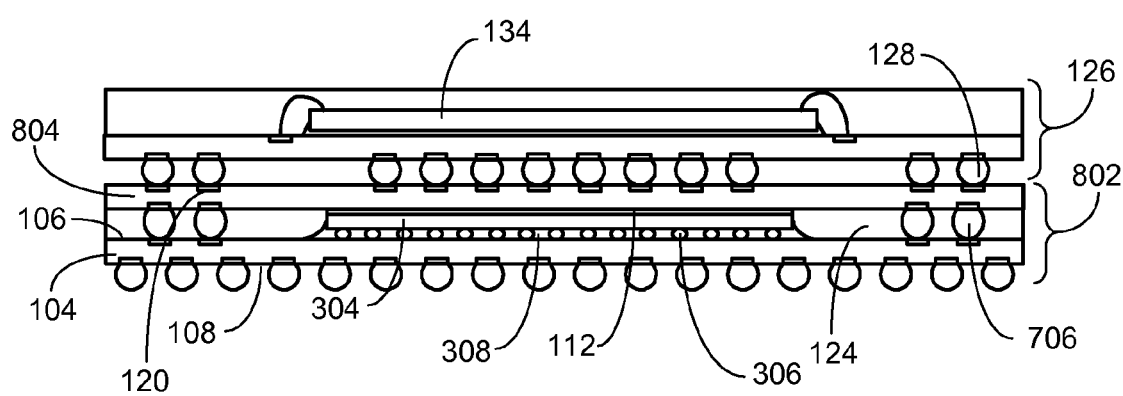
FIG. 8 is a cross-sectional view similar to FIG. 1 of an integrated circuit package system with input/output expansion, in a seventh alternative embodiment of the present invention.

Referring now to FIG. 8, therein is shown a cross-sectional view similar to FIG. 1 of an integrated circuit package system 800 with input/output expansion, in a seventh alternative embodiment of the present invention. The cross-sectional view of the integrated circuit package system 800 depicts a base stacking package 802 including the base substrate 104 having the component side 106 and the system side 108. The integrated circuit 304, such as a flip chip integrated circuit, may be mounted on the component side 106 by the chip interconnects 306, such as solder balls, solder columns, solder bumps, or stud bumps. The under-fill material 308 may optionally be applied on the chip interconnects 306, between the integrated circuit 304 and the component side 106 of the base substrate 104.

An input/output expansion substrate 804, such as a laminate substrate, a ceramic substrate, or a tape substrate, may be mounted over the integrated circuit 304 by the adhesive 112. The input/output expansion substrate 804 may be a contiguous structure without internal openings. The bonding contact 120 may be formed on the top surface and the bottom surface of the input/output expansion substrate 804. The interposer interconnect 706 may be coupled between the component side 106 of the base substrate 104 and the bonding contact 120 on the bottom side of the input/output expansion substrate 804.

The base stacking package 802 may be formed by injecting the molding compound 124, such as an epoxy molding compound on the base substrate 104, the integrated circuit 304, the interposer interconnects 706, and the input/output expansion substrate 804. The molding compound 124 leaves the top surface of the input/output expansion substrate 804 exposed.

The top package 126 may be coupled to the top surface of the input/output expansion substrate 804 by the system interconnects 128, such as solder balls, solder columns, solder bumps, or stud bumps. The number and position of the system interconnects 128 is an example only. A different number of the system interconnects 128 may be used to provide conductive paths between the top package integrated circuit 134, the integrated circuit 304, the system interconnects 128 on the system side 108 of the base substrate 104, or a combination thereof.

Figure 9:
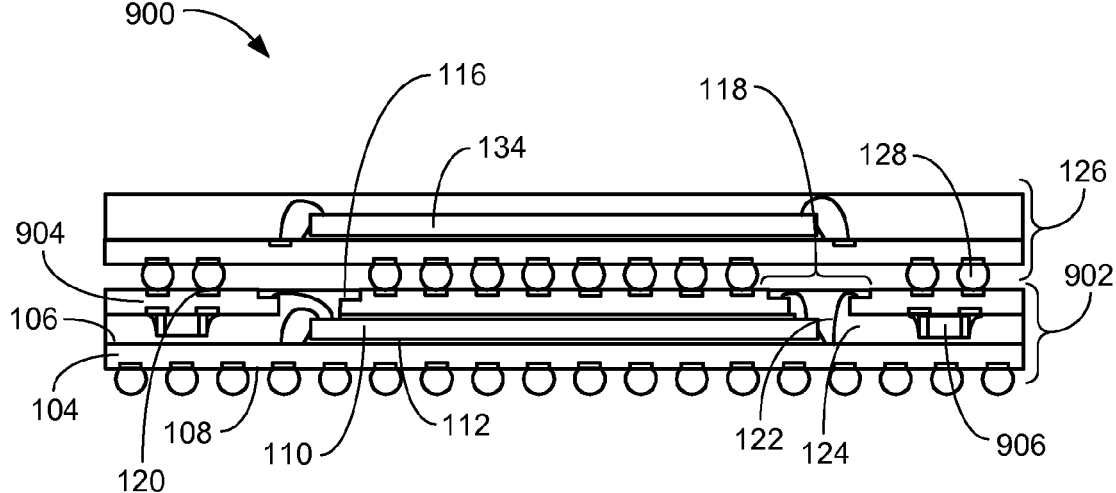
FIG. 9 is a cross-sectional view similar to FIG. 1 of an integrated circuit package system with input/output expansion, in an eighth alternative embodiment of the present invention.

Referring now to FIG. 9, therein is shown a cross-sectional view similar to FIG. 1 of an integrated circuit package system 900 with input/output expansion, in an eighth alternative embodiment of the present invention. The cross-sectional view of the integrated circuit package system 900 depicts a base stacking package 902 including the base substrate 104 having the component side 106 and the system side 108. The integrated circuit 110 may be mounted on the component side 106 by the adhesive 112.

An input/output expansion substrate 904 may be mounted over the integrated circuit 110 by the adhesive 112. The input/output expansion substrate 904 may have the recessed step 116 along the edge of the access port 118. The bonding contact 120 may be formed on the top and bottom surfaces of the input/output expansion substrate 904 including on the recessed step 116. The electrical interconnects 122 may be coupled between the active side of the integrated circuit 110, the component side 106 of the base substrate 104, the bonding contact 120 on the recessed step 116, or a combination thereof.

A discrete component 906, such as a resistor, a capacitor, an inductor, a voltage regulator, or the like, may be coupled to the bottom surface of the input/output expansion substrate 904. By providing the discrete component 906, additional functions may be supported in the top package 126 or the base stacking package 902.

The base stacking package 902 may be formed by injecting the molding compound 124, such as an epoxy molding compound on the base substrate 104, the integrated circuit 110, the electrical interconnects 122, the discrete component 906, and the input/output expansion substrate 904. The molding compound 124 provides a flat surface on the base stacking package 902 while leaving the top surface of the input/output expansion substrate 904 exposed.

The top package 126 may be coupled to the top surface of the input/output expansion substrate 904 by the system interconnects 128. The number and position of the system interconnects 128 is an example only. A different number of the system interconnects 128 may be used to provide conductive paths between the top package integrated circuit 134, the integrated circuit 110, the system interconnects 128 on the system side 108 of the base substrate 104, the discrete component 906, or a combination thereof.

Figure 10:
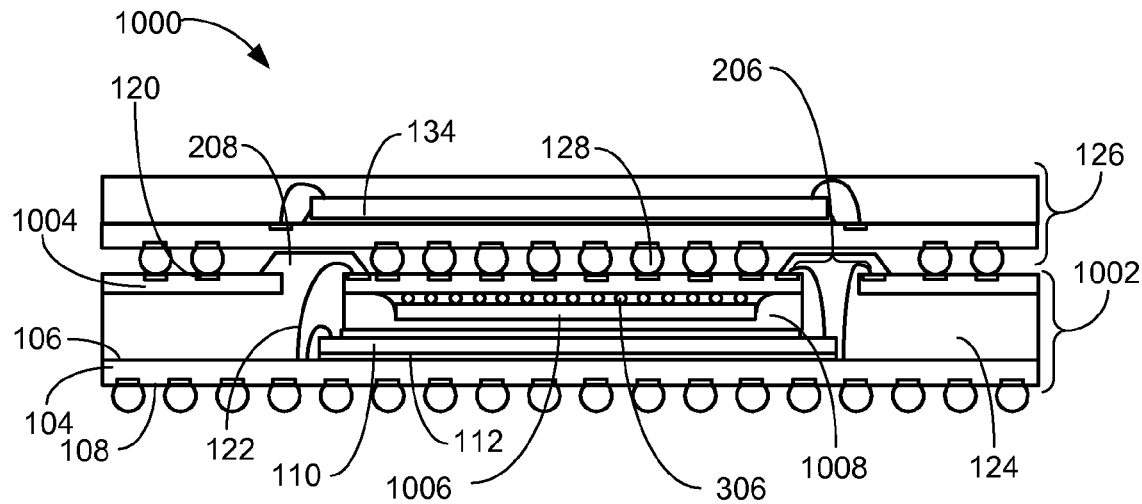
FIG. 10 is a cross-sectional view similar to FIG. 1 of an integrated circuit package system with input/output expansion, in a ninth alternative embodiment of the present invention.

Referring now to FIG. 10, therein is shown a cross-sectional view similar to FIG. 1 of an integrated circuit package system 1000 with input/output expansion, in a ninth alternative embodiment of the present invention. The cross-sectional view of the integrated circuit package system 1000 depicts a base stacking package 1002 including the base substrate 104 having the component side 106 and the system side 108. The integrated circuit 110 may be mounted on the component side 106 by the adhesive 112.

An input/output expansion substrate 1004, such as an internal stacking module (ISM), may be mounted over the integrated circuit 110 by the adhesive 112. The input/output expansion substrate 1004 may have an ISM integrated circuit 1006 coupled to the bottom surface by the chip interconnects 306. The ISM integrated circuit 1006 may be encased by an ISM package body 1008. The ISM package body 1008 may be mounted on the integrated circuit 110 by the adhesive 112.

The base stacking package 1002 may be formed by injecting the molding compound 124, such as an epoxy molding compound on the base substrate 104, the integrated circuit 110, the electrical interconnects 122, and the input/output expansion substrate 1004. The molding compound 124 provides the mold cap 208 on the base stacking package 1002. The mold cap 208 may be on the electrical interconnects 122 and the access port 206 while leaving the top surface of the input/output expansion substrate 204 exposed. The mold cap 208 may also provide a support for the top package 126 during the reflow process in order to prevent the collapse of the system interconnects 128.

The top package 126 may be coupled to the top surface of the input/output expansion substrate 1004 by the system interconnects 128, such as solder balls, solder columns, solder bumps, or stud bumps. The number and position of the system interconnects 128 is an example only. A different number of the system interconnects 128 may be used to provide conductive paths between the top package integrated circuit 134, the integrated circuit 110, the ISM integrated circuit 1006, the system interconnects 128 on the system side 108 of the base substrate 104, or a combination thereof.

Referring now to FIG. 11, therein is shown a plan view of an integrated circuit package system 1100 with input/output expansion, in an embodiment of the present invention. The top view of the integrated circuit package system 1100 depicts an input/output expansion substrate 1102 having an inner array area 1104 and an outer array area 1106. A tie bar 1108 may connect the inner array area 1104 to the outer array area 1106. The molding compound 124 may cover the tie bar 1108, the recessed step 116, the access port 118, the bonding contacts 120, and the electrical interconnects 122, of FIG. 1. The section line 1-1 shows the intersection as viewed in FIG. 1.

The inner array area 1104 and the outer array area 1106 may have a number of the system interconnects 128 mounted thereon. The number and position of the system interconnects 128 is an example only and the actual number and position may differ. The input/output expansion substrate 1102 does provide the ability to increase the number of the system interconnects 128 available on the top of the integrated circuit package system 1100, of the present invention. This increase in the number of the system interconnects 128 enables the connection of more logic functions in the top package 126, of FIG. 1. This process can be performed without dramatically increasing the thickness, of the base stacking package 102, beyond prior art standards.

Figure 12:
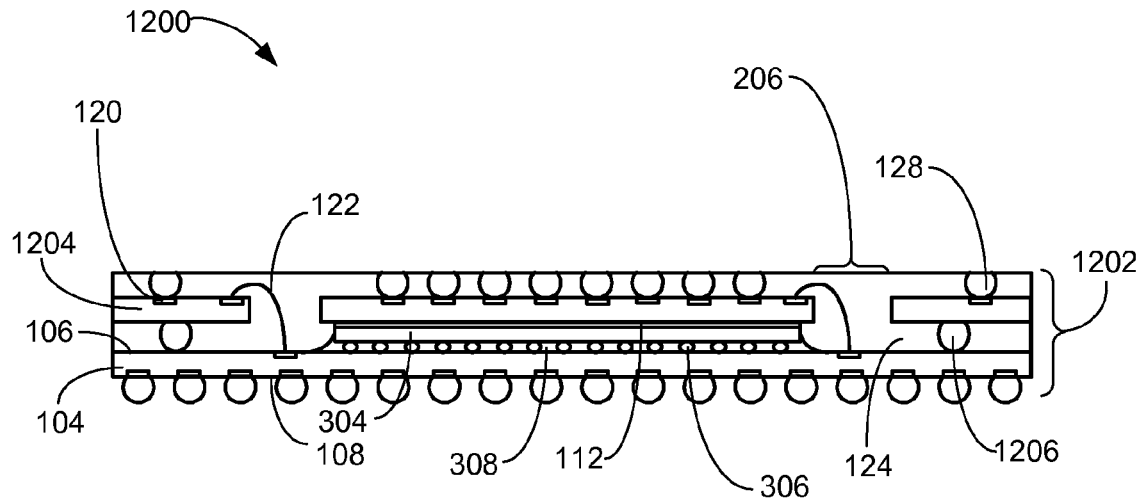
FIG. 12 is a cross-sectional view similar to FIG. 1 of an integrated circuit package system with input/output expansion, in a tenth alternative embodiment of the present invention.

Referring now to FIG. 12, therein is shown a cross-sectional view similar to FIG. 1 of an integrated circuit package system 1200 with input/output expansion, in a tenth alternative embodiment of the present invention. The cross-sectional view of the integrated circuit package system 1200 depicts a base stacking package 1202 including the base substrate 104 having the component side 106 and the system side 108. The integrated circuit 304, such as a flip chip integrated circuit, may be mounted on the component side 106 by the chip interconnects 306, such as solder balls, solder columns, solder bumps, or stud bumps. The under-fill material 308 may optionally be applied on the chip interconnects 306, between the integrated circuit 304 and the component side 106 of the base substrate 104.

An input/output expansion substrate 1204 may be mounted over the integrated circuit 304 by the adhesive 112. The input/output expansion substrate 1204 may have the access ports 206 for coupling the electrical interconnects 122 between the component side 106 of the base substrate 104 and the bonding contact 120 on the top surface. The bonding contact 120 may be formed on the top surface of the input/output expansion substrate 1204. An epoxy support 1206 may be coupled between the component side 106 of the base substrate 104 and bottom side of the input/output expansion substrate 1204. The system interconnects 128 may be coupled to the bonding contacts 120 on the top surface of the input/output expansion substrate 1204.

The base stacking package 1202 may be formed by injecting the molding compound 124, such as an epoxy molding compound on the base substrate 104, the integrated circuit 304, the epoxy support 1206, the system interconnects 128, and the input/output expansion substrate 1204. The molding compound 124 leaves the top surface of the system interconnects 128 exposed for further connection.

The top package 126, of FIG. 1, may be coupled to the top surface of the base stacking package 1202 by the system interconnects 128 embedded in the molding compound 124. The number and position of the system interconnects 128 is an example only. A different number of the system interconnects 128 may be used to provide conductive paths between the top package integrated circuit 134, of FIG. 1, the integrated circuit 304, the system interconnects 128 on the system side 108 of the base substrate 104, or a combination thereof.

Figure 13:
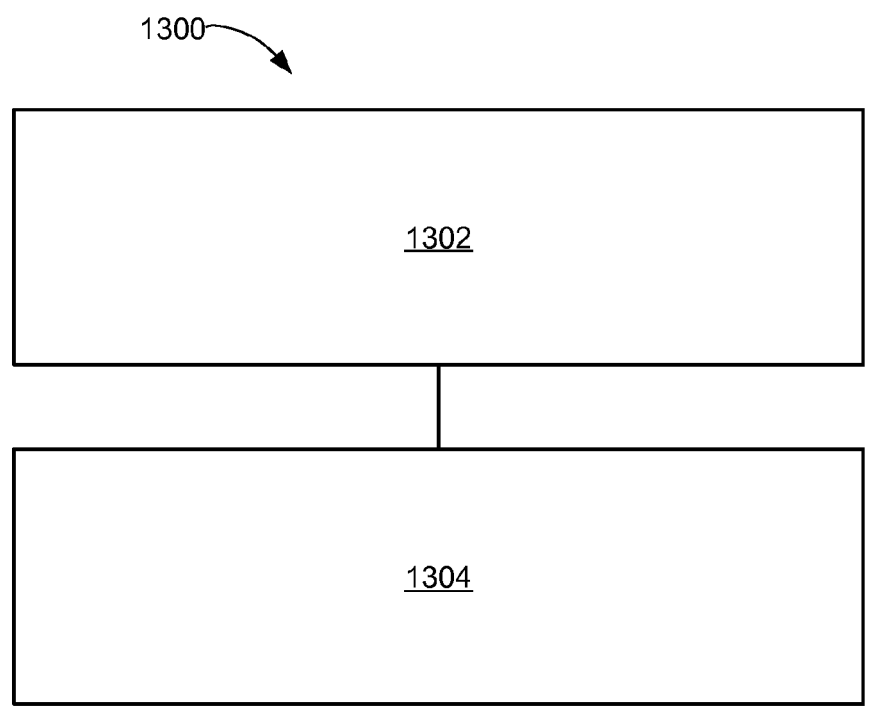
FIG. 13 is a flow chart of an integrated circuit package system for manufacturing the integrated circuit package system with input/output expansion, in an embodiment of the present invention.

Referring now to FIG. 13, therein is shown a flow chart of an integrated circuit package system 1300 for manufacturing the integrated circuit package system 100 with input/output expansion, in an embodiment of the present invention. The system 1300 includes forming a base stacking package including: fabricating a base substrate, mounting an integrated circuit on the base substrate, positioning an input/output expansion substrate, having access ports around an inner array area, over the integrated circuit, and injecting a molding compound on the base substrate, the integrated circuit, and the input/output expansion substrate in a block 1302; and mounting a top package on the input/output expansion substrate in a block 1304.

It has been discovered that the present invention thus has numerous aspects.

A principle aspect that has been discovered is that the present invention may facilitate attaching more I/O contacts to the top of a base package in a package-on-package stack.

Another aspect is the increased number of I/O contacts on the top of the base package allows more functions to be included in a top package of the package-on-package stack therefore removing other integrated circuit packages from the system board.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system with input/output expansion of the present invention furnishes important and heretofore unknown and unavailable solutions, capabilities, and functional aspects for increasing the function density in an integrated circuit system. The resulting processes and configurations are straightforward, cost-effective, uncomplicated, highly versatile and effective, can be surprisingly and unobviously implemented by adapting known technologies, and are thus readily suited for efficiently and economically manufacturing package-on-package stacked integrated circuit devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
    forming a base stacking package including:
        fabricating a base substrate,
        mounting an integrated circuit on the base substrate, the integrated circuit directly connected electrically to the base substrate,
        positioning an input/output expansion substrate, having access ports around an inner array area, over the integrated circuit, and
        injecting a molding compound on the base substrate, the integrated circuit, and the input/output expansion substrate; and
    mounting a top package on the input/output expansion substrate.

2. The method as claimed in claim 1 further comprising providing a recessed step on the access ports in the input/output expansion substrate.

3. The method as claimed in claim 1 further comprising mounting a second integrated circuit between the base substrate and the input/output expansion substrate.

4. The method as claimed in claim 1 further comprising coupling an interposer interconnect between the base substrate and the input/output expansion substrate.

5. The method as claimed in claim 1 wherein positioning the input/output expansion substrate including mounting an internal stacking module over the integrated circuit.

6. A method of manufacture of an integrated circuit package system comprising:
forming a base stacking package including:
fabricating a base substrate having a system side and a component side,
mounting an integrated circuit on the base substrate including coupling an electrical interconnect, a chip interconnect, or a combination thereof for electrically connecting the integrated circuit directly to the base substrate,
positioning an input/output expansion substrate, having access ports around an inner array area, over the integrated circuit including applying an adhesive between the integrated circuit and the input/output expansion substrate, and
injecting a molding compound on the base substrate, the integrated circuit, and the input/output expansion substrate including encapsulating the electrical interconnect, the chip interconnect, or the combination thereof; and
mounting a top package on the input/output expansion substrate including coupling a top package integrated circuit to the integrated circuit, a system interconnect on the system side of the base substrate, or a combination thereof through the input/output expansion substrate.

7. The method as claimed in claim 6 further comprising providing a recessed step on the access ports in the input/output expansion substrate including forming a bonding contact thereon.

8. The method as claimed in claim 6 further comprising mounting a second integrated circuit between the base substrate and the input/output expansion substrate including coupling a recessed step to the integrated circuit, the second integrated circuit, the component side of the base substrate, or a combination thereof.

9. The method as claimed in claim 6 further comprising coupling an interposer interconnect between the base substrate and the input/output expansion substrate including mounting a discrete component on the input/output expansion substrate for conditioning a signal between the base substrate and the input/output expansion substrate.

10. The method as claimed in claim 6 wherein positioning the input/output expansion substrate including mounting an internal stacking module over the integrated circuit including mounting an internal stacking module package body on the integrated circuit by the adhesive.

11. An integrated circuit package system including:
a base stacking package including:
a base substrate,
an integrated circuit on the base substrate, the integrated circuit directly connected electrically to the base substrate,
an input/output expansion substrate, with access ports around an inner array area, over the integrated circuit, and
a molding compound on the base substrate, the integrated circuit, and the input/output expansion substrate; and
a top package on the input/output expansion substrate.

12. The system as claimed in claim 11 further comprising a recessed step on the access ports in the input/output expansion substrate.

13. The system as claimed in claim 11 further comprising a second integrated circuit between the base substrate and the input/output expansion substrate.

14. The system as claimed in claim 11 further comprising an interposer interconnect between the base substrate and the input/output expansion substrate.

15. The system as claimed in claim 11 wherein the input/output expansion substrate includes an internal stacking module over the integrated circuit.

16. The system as claimed in claim 11 further comprising:
a system side and a component side on the base substrate;
an electrical interconnect, a chip interconnect, or a combination thereof between the integrated circuit and the base substrate;
an adhesive between the integrated circuit and the input/output expansion substrate; and
a mold cap formed on the input/output expansion substrate.

17. The system as claimed in claim 16 further comprising a recessed step on the access ports in the input/output expansion substrate includes a bonding contact thereon.

18. The system as claimed in claim 16 further comprising a second integrated circuit between the base substrate and the input/output expansion substrate includes a recessed step having the bonding contact coupled to the integrated circuit, the second integrated circuit, component side of the base substrate, or a combination thereof.

19. The system as claimed in claim 16 further comprising an interposer interconnect between the base substrate and the input/output expansion substrate includes a discrete component on the input/output expansion substrate for conditioning a signal between the base substrate and the input/output expansion substrate.

20. The system as claimed in claim 16 wherein the input/output expansion substrate over the integrated circuit includes an internal stacking module over the integrated circuit with an internal stacking module package body mounted on the integrated circuit by the adhesive.

* * * * *